US012625437B2

(12) United States Patent
Machidori

(10) Patent No.: US 12,625,437 B2
(45) Date of Patent: May 12, 2026

(54) SUBSTRATE PROCESSING APPARATUS AND SUBSTRATE PROCESSING METHOD

(71) Applicant: Tokyo Electron Limited, Tokyo (JP)

(72) Inventor: Shinichi Machidori, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 127 days.

(21) Appl. No.: 18/612,976

(22) Filed: Mar. 21, 2024

(65) Prior Publication Data

US 2024/0329547 A1     Oct. 3, 2024

(30) Foreign Application Priority Data

Mar. 29, 2023     (JP) .................................. 2023-053905

(51) Int. Cl.
G03F 7/00          (2006.01)
(52) U.S. Cl.
CPC .......... G03F 7/70825 (2013.01); G03F 7/707 (2013.01); G03F 7/70933 (2013.01)
(58) Field of Classification Search
None
See application file for complete search history.

(56) References Cited

U.S. PATENT DOCUMENTS

2019/0049845 A1*     2/2019   Yoshimura .............. G03F 7/162

FOREIGN PATENT DOCUMENTS

| JP | 2008251890 A | * | 10/2008 |
|----|--------------|---|---------|
| JP | 2014-003181 A |  | 1/2014 |

OTHER PUBLICATIONS

Machine translation: Yukihiko, I.; JP2008251890 (Year: 2008).*

* cited by examiner

*Primary Examiner* — Natasha N Campbell
(74) *Attorney, Agent, or Firm* — Venjuris, P.C.

(57)          ABSTRACT

A substrate processing apparatus includes: a base including a drive mechanism; a cover enclosing the base; a lifting body protruding from an internal region enclosed by the cover to an external region outside the internal region, and moving up and down with respect to the base by the drive mechanism; a processing body that is connected to the lifting body in the external region, and processes a substrate; and a suction tube with a suction port for sucking particles generated from the drive mechanism.

15 Claims, 12 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2023-053905, filed on Mar. 29, 2023, with the Japan Patent Office, the disclosure of which is incorporated herein in its entirety by reference.

TECHNICAL FIELD

The present disclosure relates to a substrate processing apparatus and a substrate processing method.

BACKGROUND

In manufacturing semiconductor devices, various processes are performed on a semiconductor wafer (hereinafter, referred to as "wafer") that is a substrate, in an apparatus. Japanese Patent Laid-Open Publication No. 2014-003181 describes a technology, in which when moving up/down and transferring a wafer in an apparatus, a transfer arm for holding and transferring the wafer is moved up and down using a drive mechanism including a ball screw.

SUMMARY

According to an aspect of the present disclosure, a substrate processing apparatus includes: a base including a drive mechanism; a cover enclosing the base; a lifting body protruding from an internal region enclosed by the cover to an external region outside the internal region, and moving up and down with respect to the base by the drive mechanism; a processing body that is connected to the lifting body in the external region, and processes a substrate; and a suction tube having a suction port that sucks particles generated from the drive mechanism.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
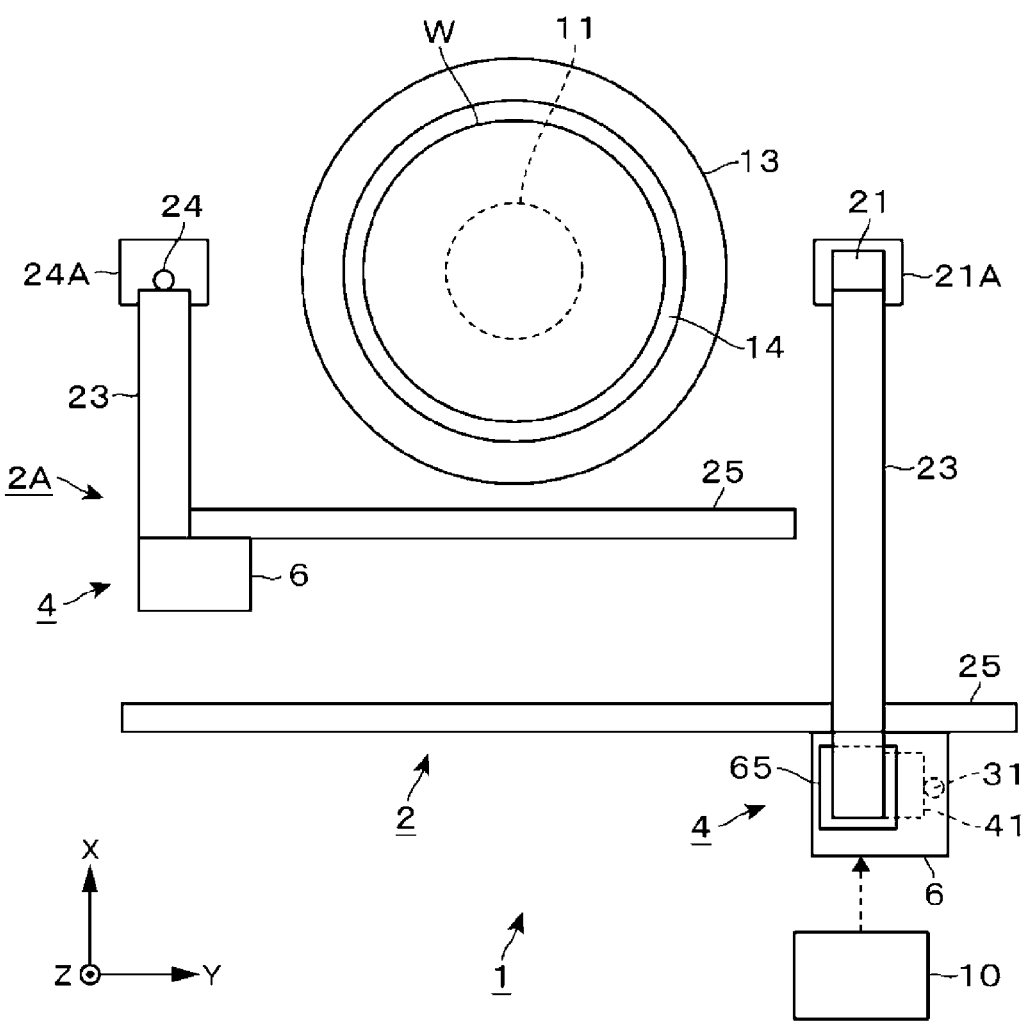
FIG. 1 is a plan view of a developing apparatus, which is a substrate processing apparatus according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

A developing apparatus 1 will be described as a substrate processing apparatus according to an embodiment of the present disclosure, with reference to the plan view of FIG. 1 and the side view of FIG. 2. In the drawings, the X and Y directions are horizontal directions, and are orthogonal to each other. The Z direction is a vertical direction. The X direction may be referred to as the front-rear direction, and the Y direction may be referred to as the left-right direction. A wafer W is transferred to the developing apparatus 1 by a transfer mechanism (not illustrated). A resist film is formed on the surface of the wafer W, and exposed along a predetermined pattern. In the developing apparatus 1, the wafer W is sequentially subjected to a developing process by supply of a developing liquid and a cleaning process by supply of a cleaning liquid.

The developing apparatus 1 includes a spin chuck 11, a rotation mechanism 12, a cup 13, a developing unit 2, and a cleaning unit 2A. The spin chuck 11 is a stage that holds the wafer W horizontally while adsorbing the center of the back surface of the wafer W. The spin chuck 11, which is a substrate holding unit, is connected to the rotation mechanism 12, to rotate around a vertical axis in a state of holding the wafer W and also rotate around the center of the wafer W.

The cup 13 surrounds the wafer W placed on the spin chuck 11 from side, and the inner surface thereof receives a processing liquid (the developing liquid and the cleaning liquid) repelled from the wafer W after supplied to the wafer W, thereby preventing the scattering of the processing liquid. Accordingly, the cup 13 is configured as a processing container that accommodates the wafer W on the spin chuck 11. The opening at the upper end of the cup is indicated by the reference numeral "14." In order to prevent the scattering of the processing liquid as described above, the upper end of the cup 13 is disposed above the upper surface of the wafer W placed and processed on the spin chuck 11. The wafer W is transferred between the transfer mechanism (not illustrated) and the spin chuck 11 through the opening 14. This transfer is performed by a lifting mechanism 15 provided in the cup 13 and including three pins.

A gas supply unit (not illustrated) is provided above the cup 13, and supplies a clean gas, for example, the air, downward to form a downflow of air in and around the cup 13. The downflow of air is formed at all times during the operation of the developing apparatus 1. In the cup 13, a liquid drain port 16 and an exhaust port 17 are formed. The processing liquid is discharged out of the cup 13 through the liquid drain port 16. Further, the air is exhausted from the exhaust port 17.

Subsequently, the developing unit 2 and the cleaning unit 2A will be described. The developing unit 2 is a mechanism that supplies the developing liquid to the wafer W to perform the developing process, and the cleaning unit 2A is a mechanism that supplies the cleaning liquid to the wafer W to perform the cleaning process. The developing liquid and the cleaning liquid are ejected from nozzles provided in the developing unit 2 and the cleaning unit 2A, respectively, to the wafer W on the spin chuck 11. The cleaning unit 2A has substantially the same configuration as the developing unit 2, except for the differences in type of the processing liquid and shape of the nozzle. Thus, the developing unit 2 will be described as representative.

The developing unit 2 includes a development nozzle 21 that ejects the developing liquid to the wafer W, a movement unit 22 provided in front of the cup 13, and an arm 23 that connects the development nozzle 21 and the movement unit 22. By the movement unit 22, the development nozzle 21 is movable horizontally in the left-right direction and vertically up and down, and may move between a standby region 24 provided outside the cup 13 and a position above the wafer W placed on the spin chuck 11. The standby region 24 is a region where the development nozzle 21 is on standby when no process is performed on the wafer W.

Figure 3:
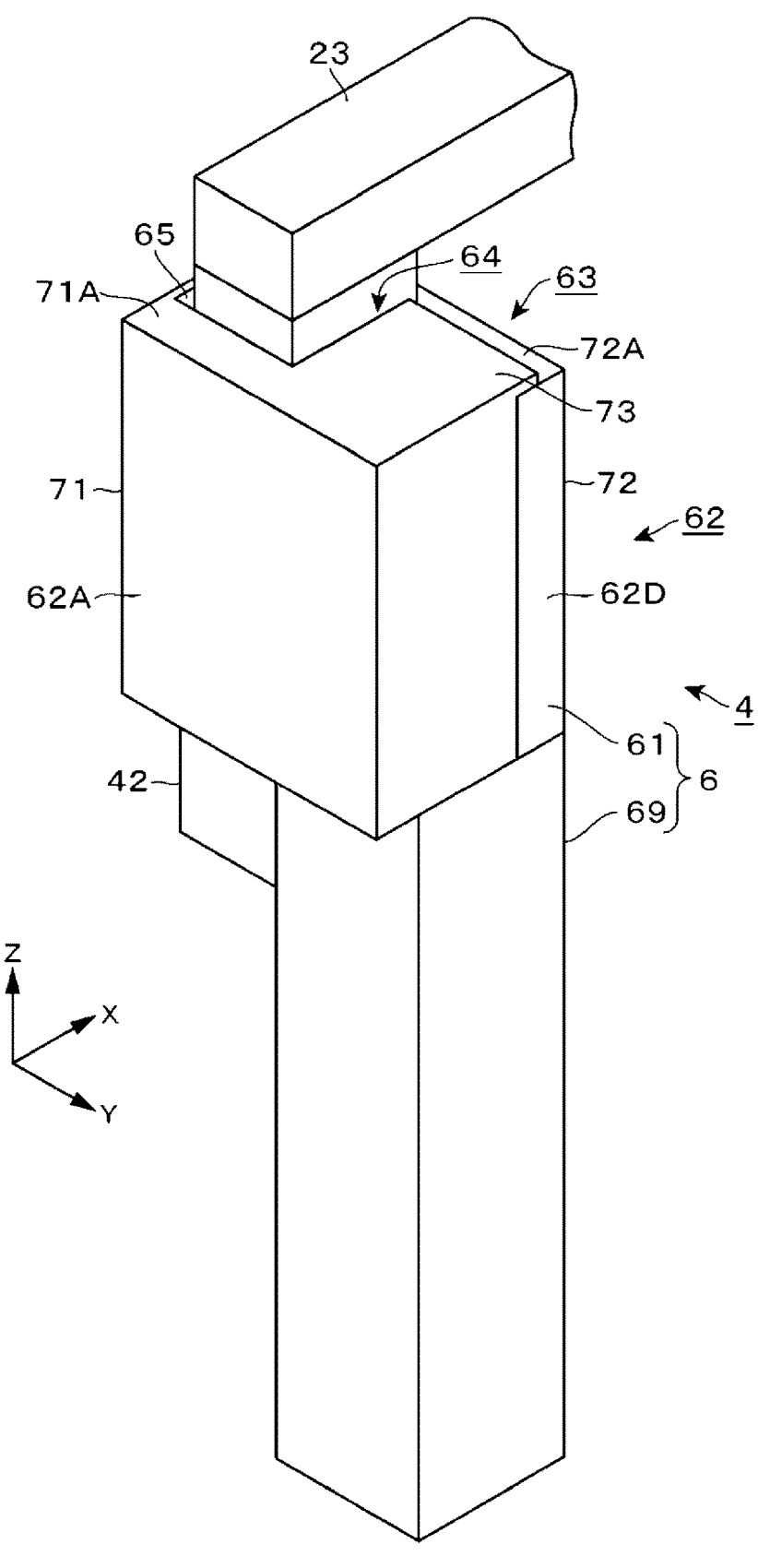
FIG. 3 is a perspective view of a lifting unit provided in the developing apparatus.

The movement unit 22 includes a lifting unit 4 that moves up and down the development nozzle 21 via the arm 23, and a horizontal movement mechanism 25 that moves the lifting unit 4 in the left-right direction. The schematic configuration of the lifting unit 4 will be described with reference to the perspective view of FIG. 3 and the exploded perspective view of FIG. 4. The lifting unit 4 includes a base unit 41, a lifting body 42, a suction tube 31, and a cover unit 6. The base unit 41 includes a drive mechanism 5, and moves up and down the lifting body 42 connected to the arm 23. The cover unit 6 encloses the base unit 41 and the lifting body 42 to suppress particles generated from the drive mechanism 5 from scattering into the surroundings. The space enclosed by the cover unit 6 is the internal region, and the space outside the cover unit 6 where the cup 13 is provided is the external region. The upper end of the lifting body 42 protrudes into the external region, and the proximal end of the arm 23 is connected to the upper end of the lifting body 42 positioned in the external region. The distal end of the arm 23 extends horizontally rearward, and supports the development nozzle 21, which ejects the developing liquid downward. The arm 23 is a support member that supports the development nozzle 21 serving as a processing unit.

When the lifting body 42 moves up and down, the slider 56 and the lifting body 42 move inside the cover unit 6, and thus, the volume of the space in the cover unit 6 changes. More specifically, when the lifting body 42 and the slider 56 move up, the volume of the space is extruded upward by the amount of movement of the lifting body 42 and the slider 56. In order not to interfere with the upward/downward movement of the lifting body 42, a small gap 65 is formed between the cover unit 6 and the lifting body 42 (hereinafter, referred to as a "lifting gap"). However, when the volume of the space in the cover unit 6 is extruded by the amount of movement of the lifting body 42 and the slider 56, particles may be released to the outside of the cover unit 6 through the lifting gap 65. In this case, the particles may be released into the cup 13 that forms the space for processing the wafer W, and adhere to the wafer W. In order to prevent the release of the particles, the suction tube 31 is provided as a suction unit inside the cover unit 6. When the suction tube 31 performs an exhaust, the particles are sucked and removed. Further, the air outside the cover unit 6 flows into the cover unit 6 through the lifting gap 65, and then, flows into the suction tube 31.

Figure 6:
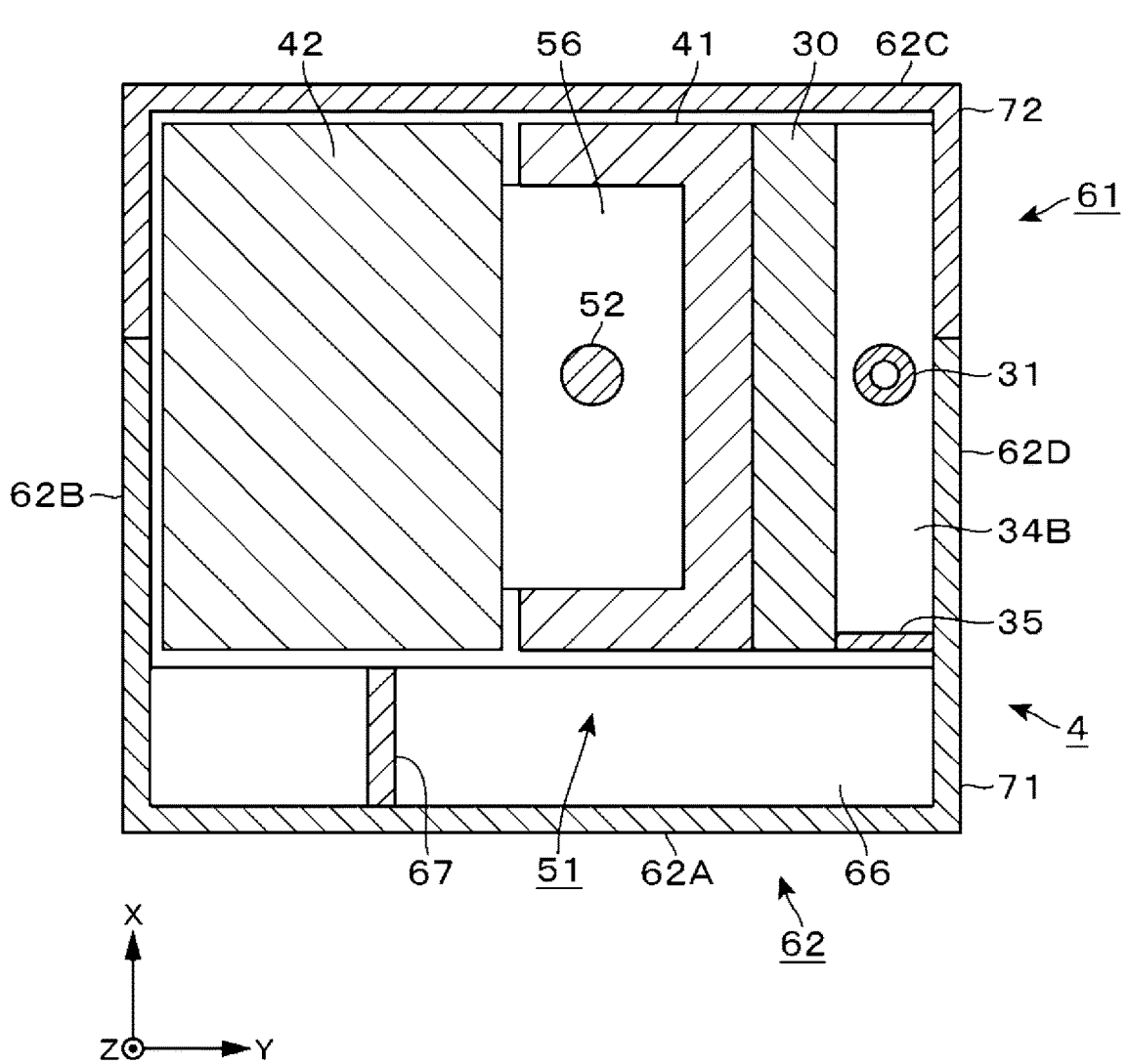
FIG. 6 is a horizontal cross-sectional plan view of the lifting unit.
Figure 7:
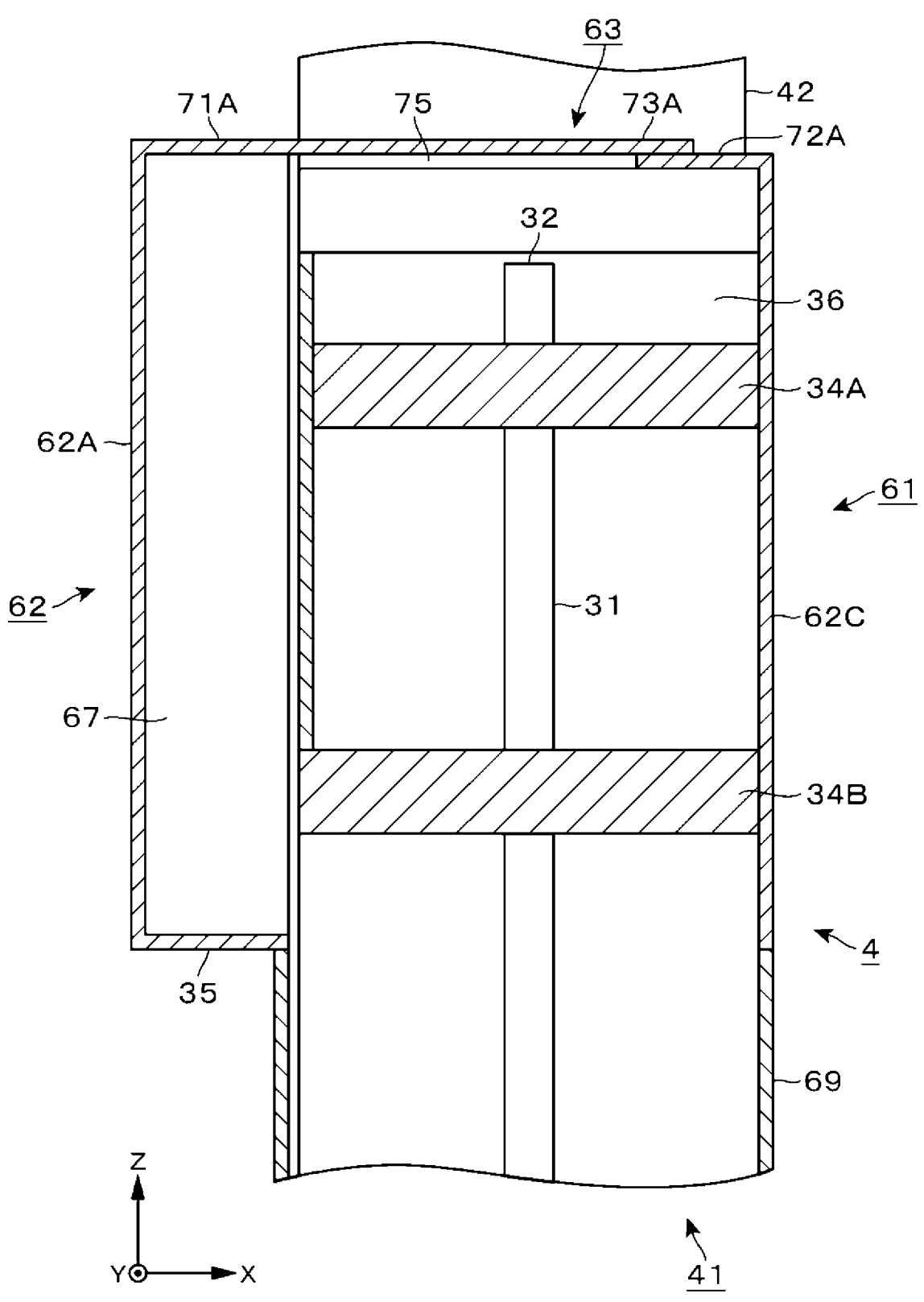
FIG. 7 is a vertical cross-sectional side view of the lifting unit.

Hereinafter, the lifting unit 4 will be described in detail with reference to the vertical cross-sectional front view of FIG. 5, the horizontal cross-sectional plan view of FIG. 6, and the vertical cross-sectional side view of FIG. 7. FIG. 6 is a cross-sectional view taken along a line A-A' of FIG. 5. The lifting body 42 has a rectangular parallelepiped shape that extends vertically. In top view, two of the four sides forming the contour of the lifting body 42 extend along the front-rear direction (the X direction), and the remaining two sides extend along the left-right direction (the Y direction). The arm 23 is connected to the upper end surface of the lifting body 42. The base unit 41 is provided on the right side of the lifting body 42.

The base unit 41 is configured with the drive mechanism 5 and a suction tube support unit 30 that supports the suction tube 31. The drive mechanism 5 is configured with a linear movement unit 51 including a ball screw 52, and a motor 59, and connected to the horizontal movement mechanism 25 to be movable in the left-right direction.

The linear movement unit (straightly movable mechanism) 51 has the substantially rectangular parallelepiped shape that is elongated vertically and has the side surface facing the side surface of the lifting body 42. The linear movement unit 51 includes the ball screw 52 that extends vertically, bearing units 53 and 54 to which the upper and lower ends of the ball screw 52 are connected, respectively, an enclosure unit 55, and the slider 56 movable up and down. The enclosure unit 55 has a concave shape in horizontal cross-sectional plan view, extends vertically, encloses the ball screw 52 from front side, rear side, and right side, and includes a member connected to the slider 56 to guide the upward/downward movement of the slider 56. The bearing units 53 and 54 are provided at the top and the bottom of the enclosure unit 55, respectively. The bearing unit 53 makes up the upper end of the linear movement unit 51, and the reference numeral "53A" in the bearing unit 53 indicates a sliding portion at which the sliding along with the ball screw 52 is performed. Specifically, the sliding portion 53A is formed as a through hole vertically drilled in the bearing unit 53, and the ball screw 52 is inserted through the through hole. The motor 59 is provided below the bearing unit 54, and rotates the ball screw 52 around the axis of the ball screw 52.

The slider 56 is provided in the region enclosed by the enclosure unit 55 while being connected to the ball screw 52, and moves up and down in the region along the rotation of the ball screw 52. The slider 56 may move up and down in the upwardly/downwardly movable range from the position in contact with the bearing unit 53 to the position in contact with the bearing unit 54, and the center of the height of the upwardly/downwardly movable range is indicated by "H" in FIG. 5. The right surface of the lifting body 42 is connected to the left surface of the slider 56, and the slider 56 and the lifting body 42 are arranged side by side in the left-right direction (the Y direction). Accordingly, the slider 56, the lifting body 42, and furthermore, the development nozzle 21 connected to the lifting body 42 move up and down along with the rotation operation of the motor 59 and the ball screw 52.

The suction tube support unit 30 is a thick plate-shaped member connected to the linear movement unit 51 from right side such that the thickness direction of the suction tube support unit 30 becomes the left-right direction, and is configured with a vertically elongated rectangular plate. The upper end of the suction pipe support unit 30 is disposed slightly lower than the upper end of the linear movement unit 51 in order not to obstruct the air flow formed on the bearing unit 53 to be described later. Since the width of the suction tube support unit 30 in the front-rear direction and the width of the linear movement unit 51 in the front-rear direction are the same, and the positions of the front and rear ends thereof are aligned, the suction tube support unit 30 and the linear movement unit 51 form a single rectangular parallelepiped shape in contour view.

The suction tube 31 is provided on the right side of the suction tube support unit 30. Accordingly, the lifting body 42, the base unit 41, and the suction tube 31 are arranged in this order in a row toward the right side. That is, these components are arranged in the Y direction. The suction port 32 forming the upstream end of the suction tube 31 is opened vertically upward, and may form the air flow above the linear movement unit 51 as described in detail later. The position of the suction port 32 will be described in more detail. The suction port 32 is opened at a height slightly lower than the upper end of the suction tube support unit 30. Thus, the height of the suction port 32 is lower than the upper end of the linear movement unit 51, and higher than the center H of the height of the upwardly/downwardly movable range of the slider 56 described above. Further, the suction port 32 is disposed on the right side of the center of the suction tube support unit 30 in the front-rear direction (the X direction), and disposed on the right side of the sliding portion 53A of the linear movement unit 51.

The suction tube 31 extends vertically from the position of the suction port 32 toward the bottom of the suction tube support unit 30, and is drawn to the outside of the space enclosed by a lower cover 69 to be described later, to be connected to an exhaust mechanism 33. The exhaust mechanism 33 is configured with, for example, an ejector. By the operation of the exhaust mechanism 33, a switching is performed between a state in which the suction from the suction port 32 is performed and a state in which the suction is stopped.

The suction tube support unit 30 includes fixing members provided in three tiers vertically spaced apart from each other to fix the suction tube 31, and the fixing members are denoted with 34A, 34B, and 34C in this order from top to bottom. Each of the fixing members 34A to 34C is configured with a rectangular block extending in the front-rear direction (the X-direction), i.e., in the horizontal direction. A through hole is vertically formed at the center of each of the fixing members 34A to 34C in the front-rear direction, and the upstream-side portion of the suction tube 31 is fixed to the suction tube support unit 30 by being inserted through the through holes of the fixing members 34A to 34C. Since the fixing members 34A to 34C are provided in this way, the fixing members 34A to 34C each appear to extend forward and rearward from the suction tube 31 in top view.

Among the fixing members 34A to 34C, the fixing member 34A disposed closest to the suction port 32 also serves to define the space where the suction port 32 is disposed, from the surrounding space in order to enhance the suction force by the suction tube 31 as described in detail later. The fixing member 34A is disposed slightly below the upper end of the suction tube 31 and above the center H of the height described above. The fixing members 34A and 34B are provided at the height covered by an upper cover 61 to be described later, and the positional relationship with the upper cover 61 will be described in detail later. The fixing member 34C is provided at the height covered by a lower cover 69.

Since the lifting unit 4 moves in the left-right direction as described above, the suction tube 31 includes a flexible portion at least at the upstream side relative to the position where the suction tube 31 is fixed by the fixing member 34C (on the side of the exhaust mechanism 33), in order not to interfere with the movement of the lifting unit 4. Specifically, the suction tube 31 has the flexibility by adopting a bellows structure, but the illustration of bellows is omitted.

At the front end of the suction tube support unit 30 (the end on the opposite side to the extension direction of the arm 23), a front-rear partition plate 35 is provided to protrude rightward (i.e., in the Y direction) from the front end of the suction tube support unit 30 while extending perpendicularly, i.e., vertically, to divide the space in the front-rear direction (the X direction). The front-rear partition plate 35 is a rectangular plate, and extends vertically from the upper end of the suction tube support unit 30 to reach the upper surface of the fixing member 34B. Accordingly, the upper and lower ends of the front-rear partition plate 35 are positioned above and below with respect to the suction port 32, respectively, and the front end surface of the fixing member 34A is connected to the rear surface of the front-rear partition plate 35. The role of the front-rear partition plate 35 will be described later.

Subsequently, the cover unit 6 will be described. The cover unit 6 is fixed to the base unit 41 by fixing tools such as screws (not illustrated), and configured with the upper cover 61 and the lower cover 69. The upper cover 61 is configured as a rectangular housing, and includes a vertically upright side wall 62, a horizontal top wall 63, and a bottom wall mostly cut out while leaving a portion. In plan view, among the four sides that form the contour of the upper cover 61, two sides are formed along the front-rear direction (the X direction), and the remaining two sides are formed along the left-right direction (the Y direction). To discriminate the portions that make up the four sides above, the side wall 62 may be referred to as a front wall 62A, a left wall 62B, a rear wall 62C, and a right wall 62D in the clockwise order from the front side (the opposite side to the extension direction of the arm 23). The side wall 62 and the top wall 63 cover the upper portion of the base unit 41 and the portion of the suction tube 31 disposed at the upper portion of the base unit 41, from side and from above, respectively. The lifting body 42 is enclosed by the side wall 62, and the upper portion thereof protrudes above the upper cover 61.

The lower cover 69 is formed in the shape of a vertically elongated rectangular parallelepiped housing having no upper wall and left wall. The lower cover 69 covers the lower portion of the base unit 41 and the portion of the suction tube 31 at the lower portion of the base unit 41. The upper end of the lower cover 69 and the lower end of the upper cover 61 are connected to each other, and the space enclosed by the upper cover 61 and the space enclosed by the lower cover 69 communicate with each other. Similarly to the upper cover 61, the four sides of the lower cover 69 in plan view are formed along the front-rear direction and the left-right direction.

Hereinafter, the upper cover 61 will be described in detail. The upper cover 61 may be separated into a front cover 71 and a rear cover 72. The front cover 71 and the rear cover 72 are separate bodies in the front-rear direction (the X direction) obtained by dividing the upper cover 61 along the left-right direction (the Y direction). Thus, the front cover 71 is configured as a housing opened at the bottom and the rear side thereof (the extension direction of the arm 23), and makes up the front part of each of the right wall 62D, the left wall 62B, and the top wall 63, and the front wall 62A. The rear cover 72 is configured as a housing opened at the bottom and the front side thereof (the opposite direction to the extension direction of the arm 23), and makes up the rear part of each of the right wall 62D, the left wall 62B, and the top wall 63, and the rear wall 62C.

The rear end of the portion of the front cover 71 that makes up the top wall 63 (referred to as the top wall front part forming portion 71A) protrudes rearward relative to the portions of the front cover 71 that make up the right wall 62D and the left wall 62B, to form a protruding piece 73. When the rear cover 72 is fixed to the base unit 41, the portion of the rear cover 72 that makes up the top wall 63 (referred to as the top wall rear part forming portion 72A) is supported on the upper surface of the linear movement unit 51. Further, when the front cover 71 is fixed to the base unit 41, the protruding piece 73 is supported on the top wall rear part forming portion 72A. Accordingly, the top wall 63 of the upper cover 61 partially has a structure of a double wall 73A in the front-rear direction, which forms a step between the upper and lower surfaces thereof.

The width of the front cover 71 in the front-rear direction is larger than that of the rear cover 72. Thus, when the front cover 71 and the rear cover 72 are fixed to the base unit 41 as described above, no gap is formed between the top wall 63 and the rear end of the linear movement unit 51, and an exhaust gap 75 is formed between the top wall 63 and the region from the center of the upper surface of the linear movement unit 51 to the front end thereof. Thus, the region above the sliding portion 53A of the linear movement unit 51 is also configured as the exhaust gap 75.

The top wall 63 will be described in more detail. Since a portion of the rear end of the top wall front part forming portion 71A and a portion of the front end of the top wall rear part forming portion 72A are cut out, a through hole 64 having a rectangular shape in plan view is formed at the left front corner of the top wall 63. The upper portion of the lifting body 42 projects out of the upper cover 61 through the through hole 64. The hole edge of the through hole 64 is formed along and close to the lifting body 42, and the space between the hole edge and the lifting body 42 is formed as the lifting gap 65 described above. Thus, in plan view, the lifting gap 65 is formed in the rectangular ring shape. Due to this configuration, the top wall 63 is formed on the upper side of the side wall 62 while being bent from the side wall 62 to protrude toward the lifting body 42.

The lifting gap 65 communicates with the suction port 32 of the suction tube 31 through the exhaust gap 75 described above, and the suction tube 31 is disposed on the opposite side to the lifting gap 65 in the left-right direction when viewed from the exhaust gap 75. Thus, when the suction by the suction tube 31 is performed, the air outside the space enclosed by the upper cover 61 flows into the upper cover 61 through the lifting gap 65, passes through the exhaust gap 75 serving as a suction path, and flows into the suction port 32. That is, since the air flow is formed on the bearing unit 53 where particles are relatively easily generated due to the sliding portion 53A, the particles may easily be carried into the suction port 32 along with the air flow. Thus, when the top wall 63 is provided while forming the exhaust gap 75, it contributes to improving the particle collecting efficiency.

Further, as described above, the suction port 32 is opened at the lower position than the upper end of the linear movement unit 51, and this arrangement also contributes to improving the particle collecting efficiency by enhancing the air flow at the lower side of the exhaust gap 75 in the vertical direction (i.e., the position close to the linear movement unit 51). In order to relatively increase the flow velocity in the exhaust gap 75 thereby improving the particle collecting effect, the height H1 of the exhaust gap 75 (see, e.g., FIG. 5) may be relatively low, and for example, is set to 3 mm or less.

However, since the suction port 32 is opened near the upper end of the base unit 41, i.e., at the higher position than the center H of the height of the upwardly/downwardly movable range, the suction port 32 is positioned close to the exhaust gap 75, which may enhance the air flow in the exhaust gap 75. As a result, the particle collecting effect is improved. Further, as described above, the suction port 32 of the suction tube 31 faces upward. That is, in the vertical direction, the suction port 32 is opened toward the positions of the exhaust gap 75 and the lifting gap 65, and this configuration also enhances the suction force and improves the particle collecting effect.

Further, as described above, the exhaust gap 75 is formed at the front part on the linear movement unit 51, and is not formed at the rear end on the linear movement unit 51. That is, the movement of particles by the air flow does not occur at the rear side on the linear movement unit 51 that is close to the inside of the cup 13 making up the processing space for the wafer W in the left-right direction, and the movement of particles occurs only at the front side disposed away from the cup 13. This configuration more reliably suppresses the inflow of particles into the cup 13.

Next, the side wall 62 of the upper cover 61 will be described in detail. The front wall 62A that makes up the side wall 62 and is disposed on the opposite side to the extension direction of the arm 23 is provided close to the front face of each of the linear movement unit 51, the suction tube support unit 30, and the lifting body 42, while the rear wall 62C is disposed slightly apart from the rear face of each of the members. That is, the distance between the rear wall 62C and the rear face of each of the members is longer than the distance between the front wall 62A and the front face of each of the members. In the space between the rear wall 62C and the rear face of each of the members, devices such as sensors for detecting the height position of the lifting body 42 are disposed. The left wall 62B is disposed close to the left face of the lifting body 42.

The right wall 62D is in contact with the right surfaces of the fixing members 34A and 34B and the right end of the front-rear partition plate 35. Thus, the fixing members 34A and 34B vertically partition the space of the right side with respect to the suction tube support unit 30 in the internal region enclosed by the upper cover 61. Of the partitioned spaces, the space defined by the fixing member 34A is the space where the suction tube 32 is opened. The fixing member 34A is a first partition unit, and the space above the fixing member 34A and the space below the fixing member 34A in the upper cover 61 correspond to an upper space and a lower space, respectively.

The front-rear partition plate 35 is enclosed by the upper cover 61, and partitions the space of the right side with respect to the suction tube support unit 30 in the front-rear direction (the X direction). Of the partitioned spaces, the space of the rear side (on the side in the extension direction of the arm 23) is the space where the suction port 32 is opened. The front-rear partition plate 35 is a second partition unit, and the space of the rear side and the space of the front side with respect to the front-rear partition plate 35 in the upper cover 61 correspond to a one-side space and an opposite-side space, respectively.

The space defined by the fixing member 34A and the front-rear partition plate 35 and serving as the space where the suction port 32 is opened is the suction port installation space 36. According to an aspect, the fixing member 34A and the front-rear partition plate 35 are provided to divide the space of the right side with respect to the suction tube support unit 30, such that the suction port installation space 36 where the suction port 32 is opened becomes relatively small. Further, in the suction port installation space 36, the upper space described above also corresponds to the one-side space.

With the partitioning described above, when the suction from the suction port 32 is performed such that the air flows into the suction port installation space 36 from the space adjacent to the suction port installation space 36 in the internal region of the upper cover 61, a relatively significant pressure loss occurs, and therefore, the inflow of air is suppressed. Further, since the suction port installation space 36 is relatively small as described above, the pressure in the suction port installation space 36 may be kept relatively low by the suction from the suction tube 31. As a result, the suction force at the lifting gap 65 communicating with the suction port installation space 36 is enhanced, so that the release of particles from the lifting gap 65 is more reliably suppressed.

Figure 8:
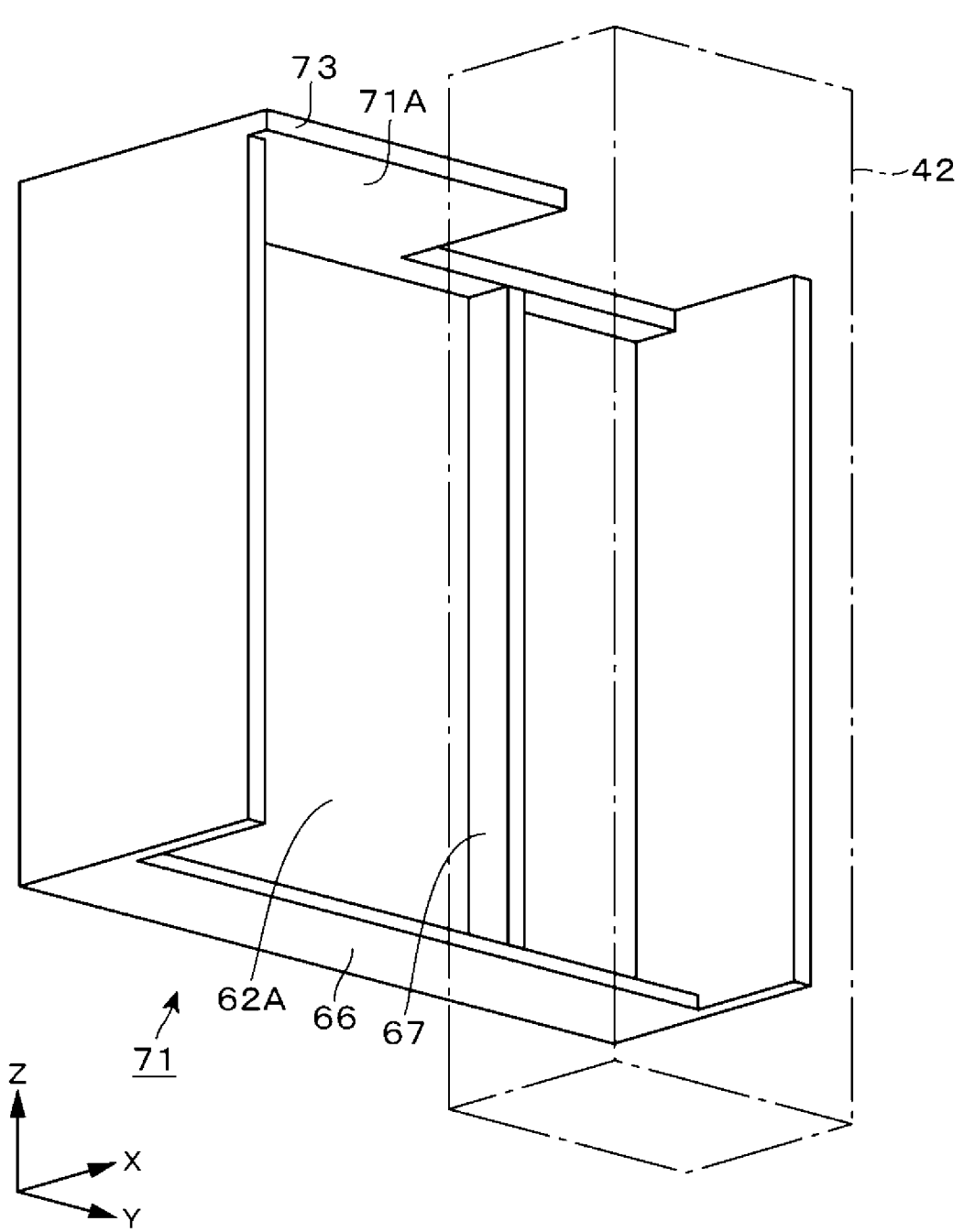
FIG. 8 is a perspective view of members that make up an upper cover included in the lifting unit.

Descriptions will be continued with reference to FIG. 8, which is a perspective view illustrating the inside of the front cover 71 that makes up the upper cover 61. The lower end of the front wall 62A protrudes horizontally rearward to form a lower partition plate 66. As described above, the upper cover 61 is a housing of which bottom wall is cut out while leaving a portion, and the lower partition plate 66 corresponds to the bottom wall. Thus, the lower partition plate 66 is provided at the position below the top wall 63 and bent from the side wall 62.

When the lifting body 42 moves up and down, the lower end thereof moves between the height of the inside of the upper cover 61 and the height below the upper cover 61. The lower partition plate 66 is formed not to interfere with the lower end of the lifting body 42 that is moving in this way. Specifically, the lower partition plate 66 has a rectangular shape in plan view, and is formed to extend from the right wall 62D to the left wall 62B. The rear end of the lower partition plate 66 is close to the linear movement unit 51, the suction tube support unit 30, and the lifting path of the lifting body 42, and prevents the air in the upper cover 61 from flowing to the outside and the outside air from flowing into the upper cover 61. When the lower partition plate 66 is provided, the flow velocity in the suction port installation space 36 increases, and the outflow of particles from the upper cover 61 is suppressed.

A left-right partition plate 67 is provided to protrude rearward from the front wall 62A, and the upper and lower ends of the left-right partition plate 67 are connected to the top wall 63 and the lower partition plate 66, respectively. The left-right partition plate 67 is rectangular and vertically elongated in side view, and is provided to divide the space between the lower partition plate 66 and the top wall 63 in the left-right direction (the Y direction), and is close to the lifting body 42 to the extent that the left-right partition plate 67 does not interfere with the movement of the lifting body 42. The left-right partition plate 67 is a third partition unit, and the left space and the right space with respect to the left-right partition plate 67 in the upper cover 61 correspond to one space and the other space, respectively.

Returning to FIG. 2, the height relationship between the upper cover 61 and the cup 13 will be described. The arm 23 moves above the cup 13 such that the development nozzle 21 may move inside and outside the cup 13 by the arm 23. Thus, the top wall 63 of the upper cover 61 at which the lifting gap 65 is formed is disposed at the higher position than the upper end of the cup 13. Meanwhile, the lower end of the upper cover 61 is disposed at the lower position than the upper end of the cup 13.

However, since the upper cover 61 is opened at the bottom thereof, the particles generated in the linear movement unit 51 may be released from the bottom of the upper cover 61, in addition to from the lifting gap 65 at the top of the upper cover 61, so as to be released to the outside of the cover unit 6. However, as described above, the lower end of the upper cover 61 is lower than the upper end of the cup 13, and the downflow of air is formed around the cup 13, so that the particles released from the bottom of the upper cover 61 hardly move into the cup 13. That is, as compared to the release of particles from the bottom of the upper cover 61, the release of particles from the lifting gap 65 significantly affects the cleanliness of the inside of the cup 13 and the upper surface of the wafer W accommodated in the cup 13. Thus, as described above, in order to enhance the suction force at the lifting gap 65, the suction port 32 of the suction tube 31 is opened near the exhaust gap 75.

Further, in order to enhance the suction force at the lifting gap 65, it is effective to suppress the inflow of gas from outside at locations other than the lifting gap 65 in the upper cover 61. To this end, the lower partition plate 66 illustrated in, for example, FIGS. 4 and 8 is provided, so that the pressure loss of air flowing from below the upper cover 61 toward the inside of the upper cover 61 relatively increases by the lower partition plate 66, which suppresses the inflow of air into the upper cover 61.

Figure 4:
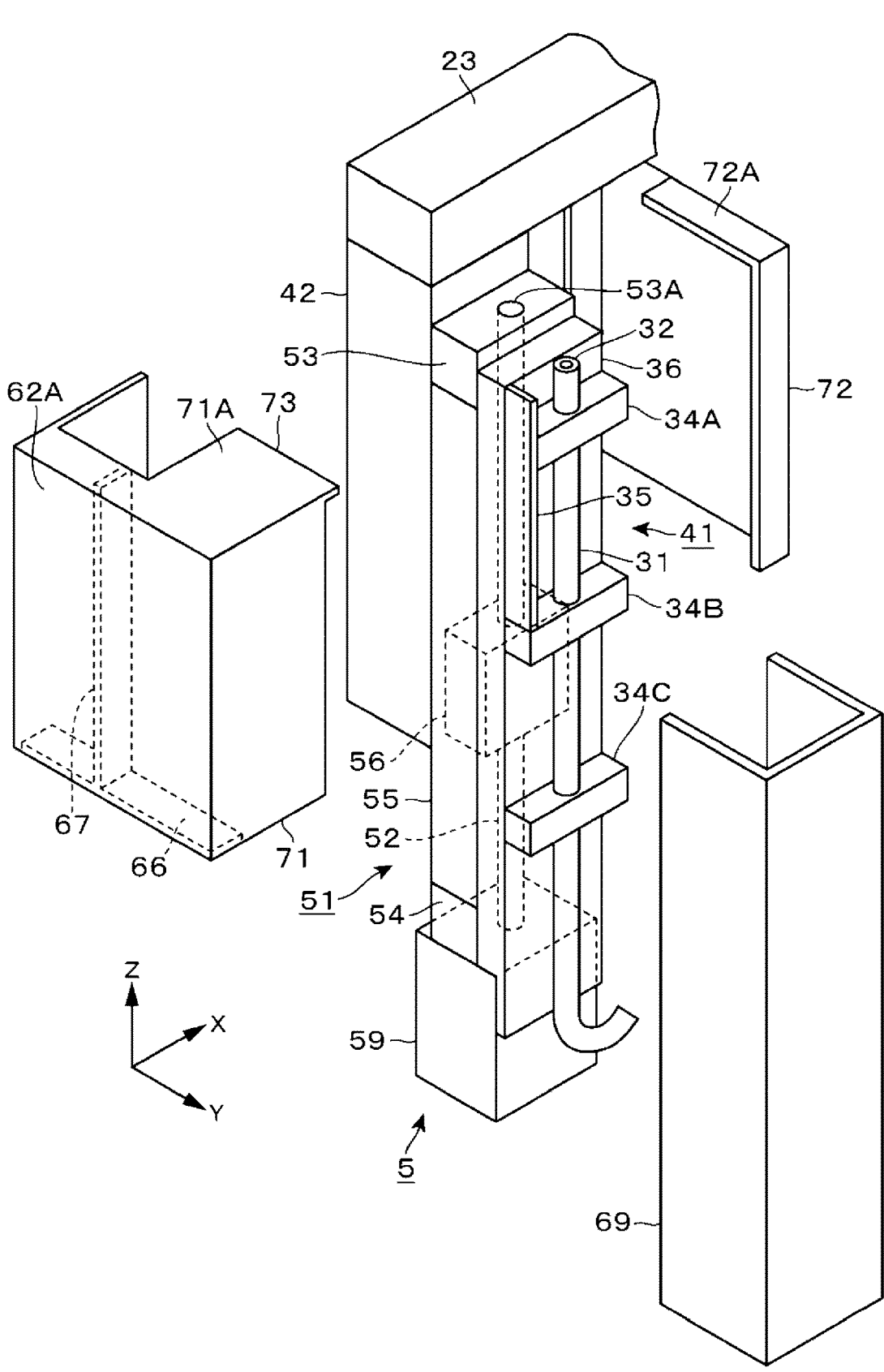
FIG. 4 is an exploded perspective view of the lifting unit.

To supplement the description of the left-right partition plate 67 illustrated in, for example, FIGS. 4 and 8, the left-right partition unit 67 functions to suppress the scattering of the particles in the upper cover 61 and more reliably introduce the particles into the suction port 32, thereby suppressing the particles from being scattered and thus released from the lifting gap 65. More specifically, since the suction pipe 31 is provided on the right side with respect to the linear movement unit 51, the particles scattered leftward from the linear movement unit 51 move in the direction being away from the suction tube 31. Accordingly, it may be understood that the particles are released from the lifting gap 65 or the bottom of the upper cover 61 without being carried by the air flow formed by the suction.

Thus, the left-right partition plate 67 is provided on the opposite side (left side) to the side where the suction tube 31 is disposed (right side) with respect to the linear movement unit 51, to divide the space of the opposite side in the left-right direction. With the left-right partition plate 67, the depth of the space on the opposite side to the suction pipe 31 is reduced when viewed from the linear movement unit 51, so that the distance in which the particles scatter toward the opposite side is reduced, and the particles may be more reliably collected by the suction from the suction tube 31.

Further, when the left-right partition plate 67 is provided, the space in the upper cover 61 is partitioned in the left-right direction, and the air hardly flows from the partitioned left space to the right space where the suction port 32 is disposed, so that the suction force of the suction port 32 at the lifting gap 65 is also enhanced. That is, similarly to the front-rear partition plate 35, the left-right partition plate 67 also takes the role of partitioning the space to improve the particle collection effect by the suction tube 31.

Figure 9:
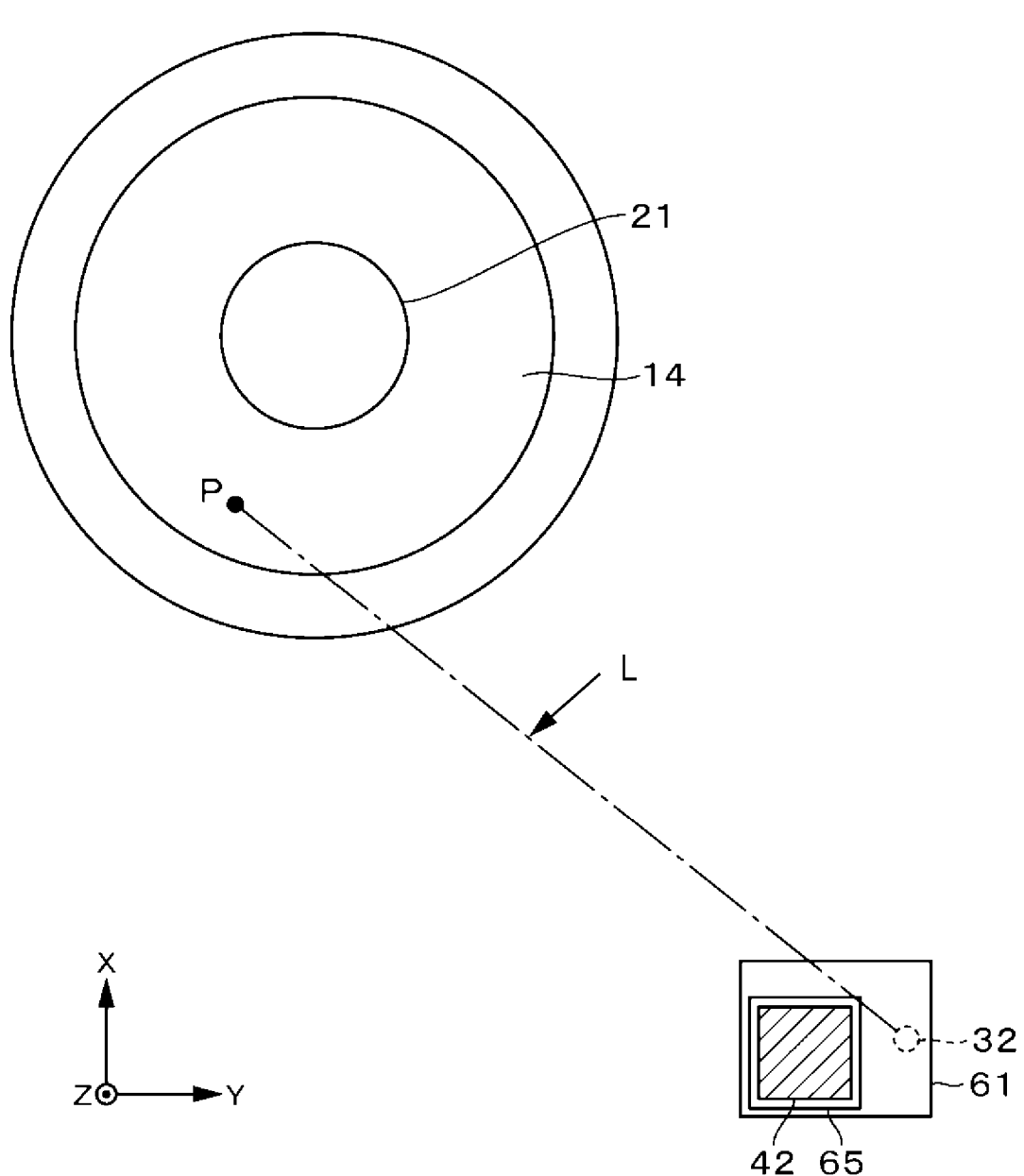
FIG. 9 is a plan view illustrating a positional relationship of members that make up the developing apparatus.

Next, the positional relationship between the lifting gap 65 of the upper cover 61 and the cup 13 will be described with reference to the plan view of FIG. 9. In plan view, the "L" indicates the straight line that connects a point P in the opening 14 of the cup 13 and the suction port 32. A numerous number of points P may be set, but the present example includes the positional relationship where the point P, the lifting gap 65, and the suction port 32 are positioned on the same straight line L as illustrated. This is because when the suction from the suction port 32 is performed, the space above the opening 14 is exhausted to form the air flow along the straight line L toward the suction port 32. Since the particles carried by the air flow may be sucked and removed, the cleaning in the opening 14 is more reliably implemented.

To also supplement the description of the lower cover 69, the right end of the fixing member 34C is connected to the right wall of the lower cover 69. The right wall of the lower cover 69 and the right wall 62D of the upper cover 61 are disposed at the same position in the left-right direction, and the rear wall of the lower cover 69 and the rear wall 62C of the upper cover 61 are disposed at the same position in the front-rear direction. The front wall of the lower cover 69 is connected to the lower surface of the lower partition plate 66. The lower cover 69 is opened at the left side thereof, but despite the opened shape, the particles generated in the space enclosed by the lower cover 69 hardly move into the cup 13 due to the downflow of air described above.

Figure 2:
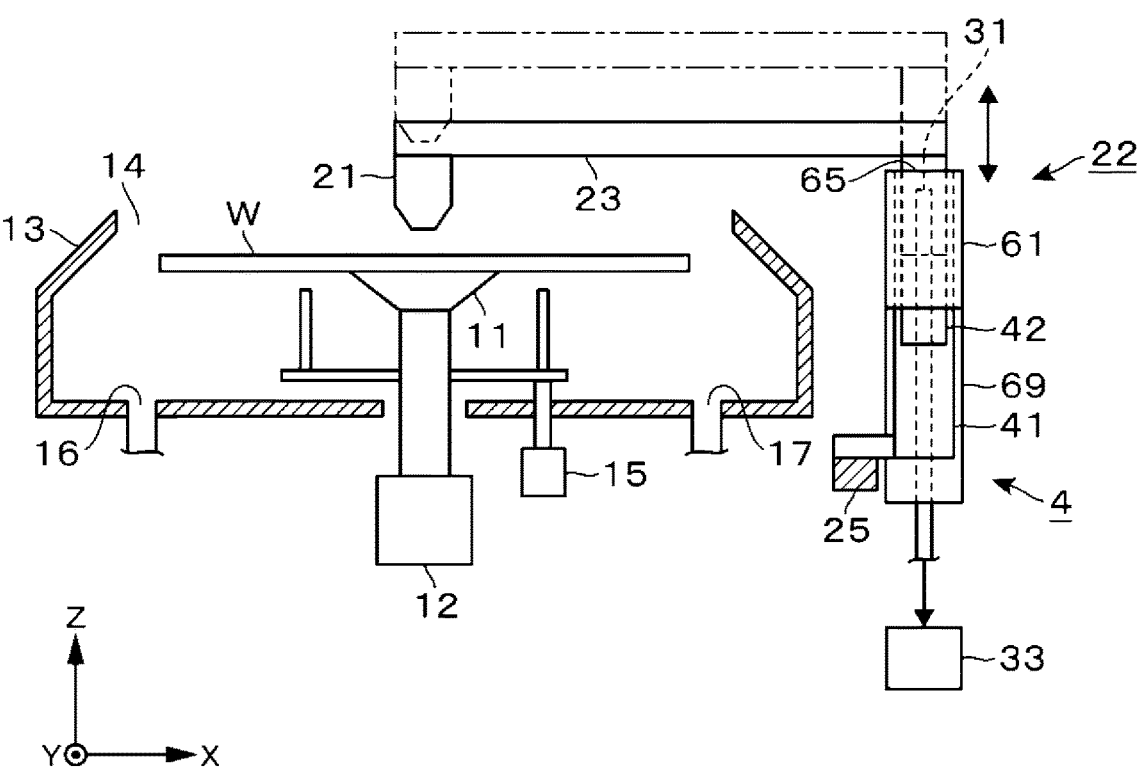
FIG. 2 is a side view of the developing apparatus.

To briefly describe the cleaning unit 2A with reference to FIG. 1, the cleaning nozzle provided on the arm 23, which corresponds to the development nozzle 21, is denoted by the reference numeral "21A." Further, the standby region for the cleaning nozzle 21A, which corresponds to the standby region 24, is denoted by the reference numeral "24A." The development nozzle 21 and the cleaning nozzle 21A are processing units that perform a processing on the wafer W.

The developing apparatus 1 further includes a control unit 10. The control unit 10 is configured with a computer, and includes programs. The programs include a group of steps to perform a series of operations in the developing apparatus 1 to be described later. With the programs, the control unit 10 outputs a control signal to each component of the developing apparatus 1, to control the operation of each component. This control includes, for example, the upward/downward movement of the nozzle by the rotation of the motor 59, the movement of the lifting unit 4 by the horizontal movement mechanism 25, the supply and cutoff of each processing liquid to the development nozzle 21 and the cleaning nozzle 21A from a processing liquid supply source (not illustrated), and the switching between the presence/absence of the suction from the suction tube 31 by the operation of the exhaust mechanism 33. The programs are stored in a storage medium such as a compact disk, a hard disk, or a DVD, and installed in the control unit 10.

The exhaust mechanism 33 is controlled such that the exhaust operation is performed during the operation of the developing apparatus 1, and the suction from the suction tube 31 is performed at all times during the operation. The terms "during the operation" of the apparatus indicates a state in which a power is supplied to the apparatus so that a processing on the wafers W becomes possible, and includes the period during which the wafer W is being processed, and the period during which the wafer W is not processed. More specifically, it is assumed that a plurality of wafers W is processed in the developing apparatus 1 during the period when the power is continuously supplied to the apparatus. The suction from the suction tube 31 is continuously performed from the time before the first wafer W of the plurality of wafers W is carried into the developing apparatus 1 until the processing of the last wafer W is completed and the wafer W is carried out of the developing apparatus 1.

Figure 10:
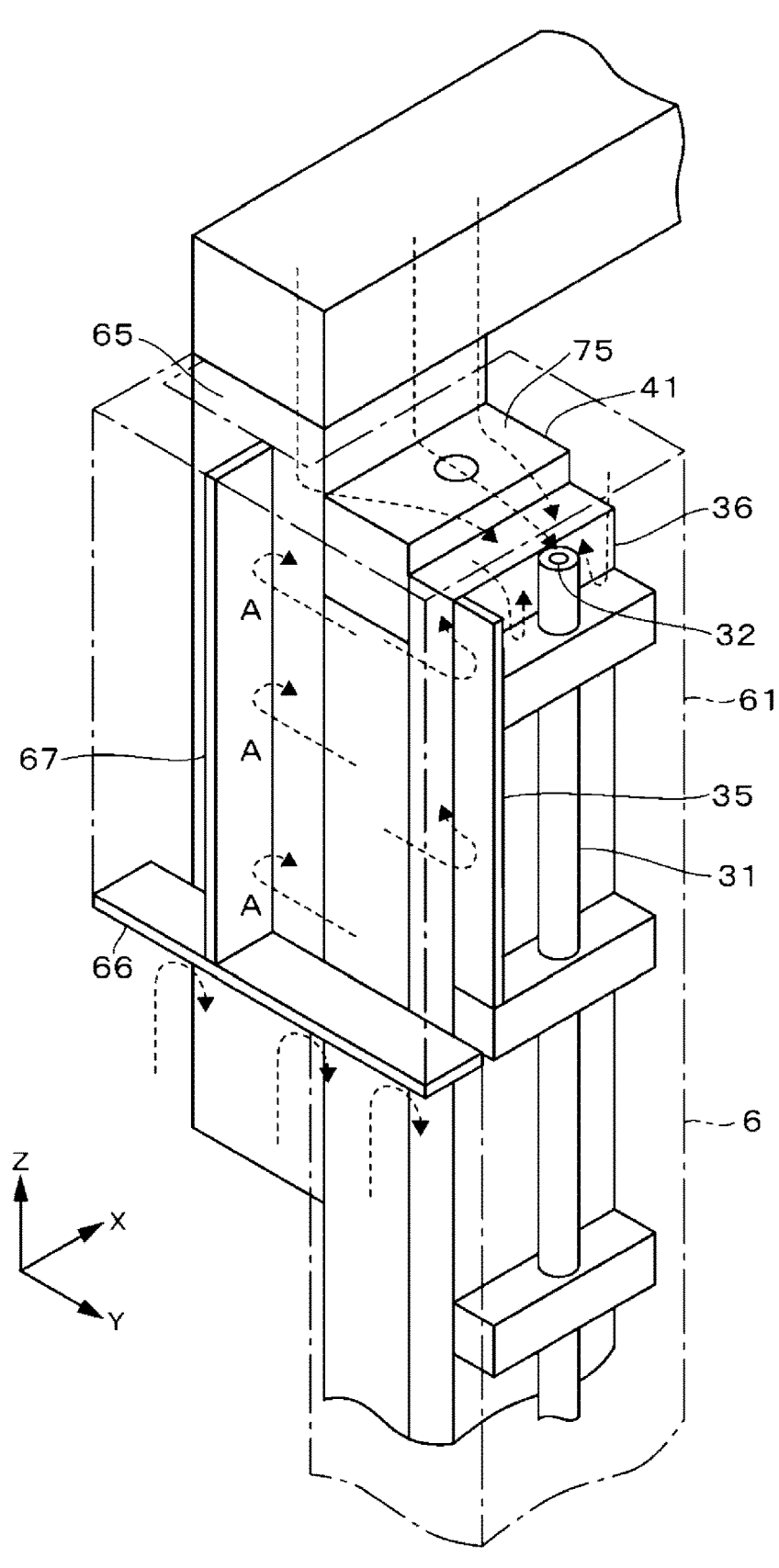
FIG. 10 is a view illustrating an air flow in the lifting unit.

Hereinafter, the operation of the developing apparatus 1 will be described. In a state where no wafer W is carried into the developing apparatus 1, and the developing apparatus 1 is on standby, the downflow of air is formed around the cup 13, and the exhaust mechanism 33 operates to perform the exhaust by the suction tube 31. FIG. 10 schematically illustrates the air flow formed in the lifting unit 4 at this time, using dashed arrows. By the suction, the air outside the cover unit 6 flows into the upper cover 61 of the cover unit 6 through the lifting gap 65, and flows toward the suction tube 31 inside the upper cover 61, forming the air flow around the base unit 41. Since the suction port 32 is disposed as described above, and the exhaust gap 75 is formed, the velocity of the air flow above the linear movement unit 51 (i.e., in the exhaust gap 75) is relatively high, so that the outflow of particles is suppressed.

As described above, the lower partition plate 66 suppresses the inflow of air into the upper cover 61 from below and the outflow of air from the inside of the upper cover 61. Further, since the inside of the upper cover 61 is partitioned by the fixing member 34A, the front-rear partition plate 35, and the left-right partition plate 67, the air flow is formed from the surrounding of the suction port installation space 36 into the suction port installation space 36, so that the suction of particles inside the upper cover 61 is accelerated.

The transfer mechanism transfers the wafer W to the developing apparatus 1, and places and rotates the wafer W on the spin chuck 11. The development nozzle 21 and the cleaning nozzle 21A that have been waiting in the standby regions 24 and 24A, respectively, move up, move in the left-right direction, and move further downward such that the lower end of each nozzle enters the cup 13. Then, the development nozzle 21 moves from the peripheral end of the wafer W toward the center of the wafer W along the radial direction of the wafer W, while ejecting the developing liquid, so that the developing liquid is supplied to the entire upper surface of the wafer W. In this way, the developing process is performed, and a pattern is formed in a resist film. The movement along the radial direction of the wafer W indicates the movement in the left-right direction.

Subsequently, the development nozzle 21 retreats from above the center of the wafer W, and the cleaning nozzle 21A moves from above the peripheral end of the wafer W to the position above the center of the wafer W. Then, the cleaning liquid is ejected from the cleaning nozzle 21A to the center of the wafer W, so that the cleaning process is performed, and the developing liquid is removed. Thereafter, the development nozzle 21 and the cleaning nozzle 21A move to the standby regions 24 and 24A, respectively, in the reverse motion of the movement into the cup 13, to enter the standby state. After the cleaning process, the wafer W is carried out of the developing apparatus 1 by the transfer mechanism.

The upward/downward movement of each of the development nozzle 21 and the cleaning nozzle 21A during the processing of the wafer W is performed by the rotation of the ball screw 52 by the motor 59 of the developing unit 2 and the cleaning unit 2A, and particles are generated by the ball screw 52, the bearing units 53 and 54, and the sliding of the slider 56. As described above, some of the particles are carried by the air flow formed in the upper cover 61, thereby being removed through the suction tube 31. The particles removed through the suction tube 31 include particles suppressed from scattering by the left-right particle unit 67. In FIG. 10, the dashed arrows A represent the flow of the particles. Further, some of the generated particles move to the outside of the cover unit 6 from the opening at the lower end of the upper cover 61 or the lower cover 69, and are pushed out by the downflow of air, thereby being removed from the suction tube 31. As described above, in the developing apparatus 1, the scattering of particles from the lifting unit 4 provided with the drive mechanism 5 is suppressed, so that the wafer W may be processed in a clean environment. Therefore, the decrease in yield of semiconductor devices manufactured from the wafers W may be suppressed.

Figure 11:
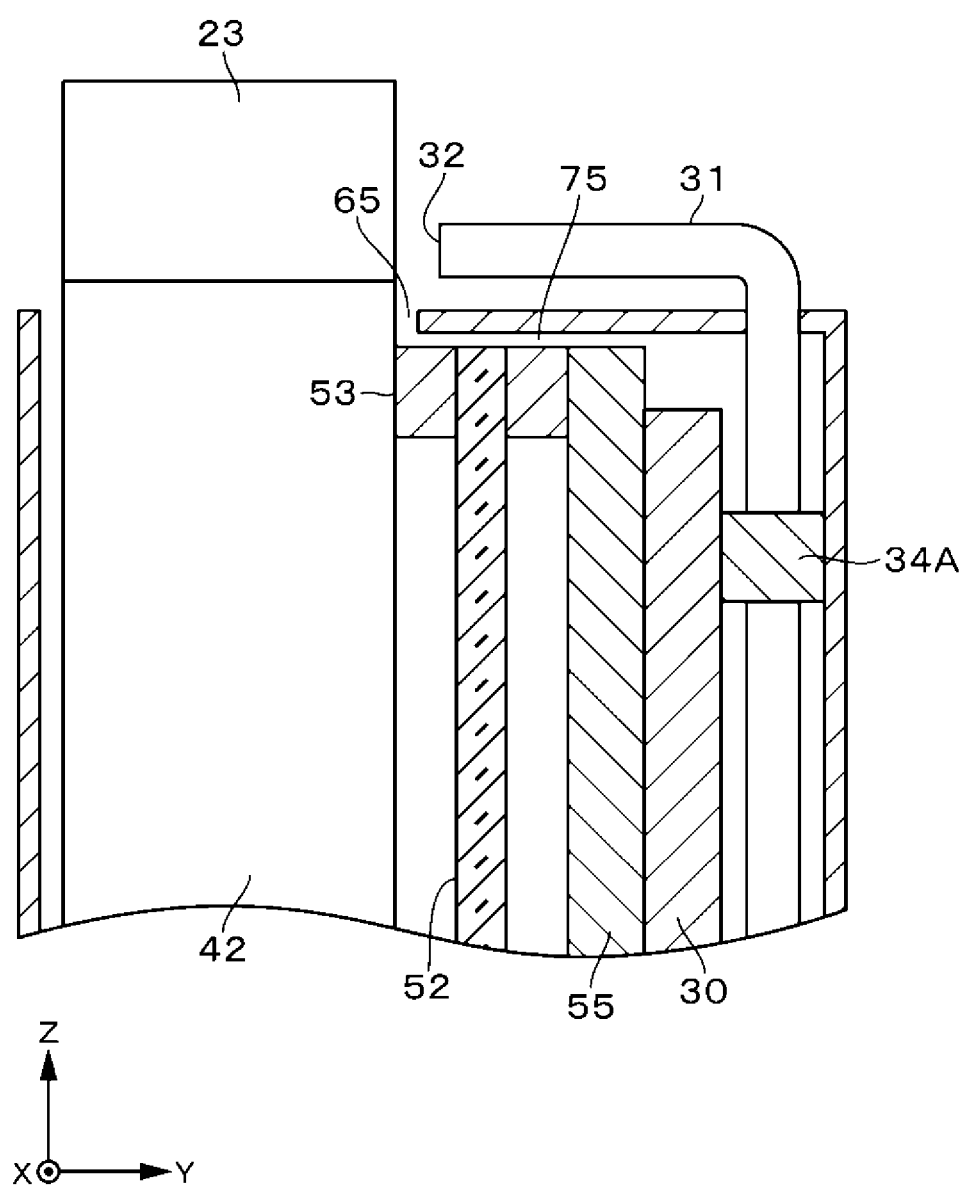
FIG. 11 is a vertical cross-sectional front view illustrating another example of the lifting unit.

FIG. 11 is a vertical cross-sectional front view of a modification of the lifting unit 4. As illustrated in FIG. 11, the upstream end of the suction tube 31 may protrude above the upper wall 63 of the cover unit 6 such that the suction port 32 is disposed near the lifting gap 65 to suck particles released from the lifting gap 65 to the outside of the cover unit 6. At this time, since a large amount of atmosphere outside the cover unit 6 may be sucked into the suction tube 31, the suction at the lifting gap 65 may be relatively low. In order to more reliably implement the high suction force at the lifting gap 65, it is preferable to provide the suction port 32 inside the cover unit 6 as illustrated in, for example, FIG. 4.

Figure 5:
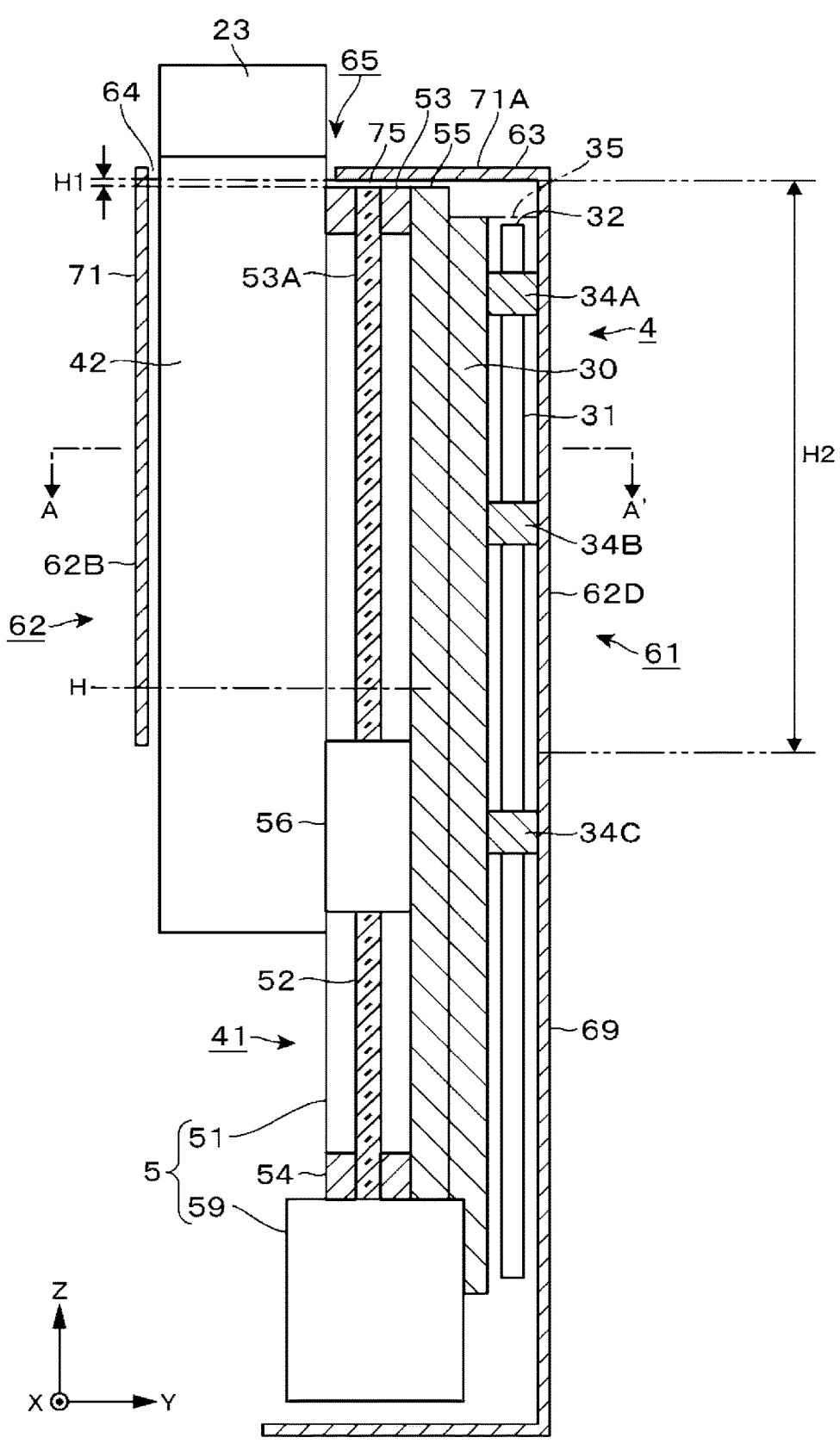
FIG. 5 is a vertical cross-sectional front view of the lifting unit.

When providing the suction port 32 in the cover unit 6 as described above, the suction port 32 may be provided at a lower position than the example described in, for example, FIG. 5, e.g., near the center H of the height of the upwardly/downwardly movable range or in the space enclosed by the lower cover 69. However, in order to more reliably suppress the release of particles from the lifting gap 65 as described above, it is preferable to provide the suction port 32 at the position described in, for example, FIG. 5.

Further, the suction port 32 of the suction tube 31 may be formed to be opened toward the side. Furthermore, a plurality of suction ports 32 opened toward the side may be provided, and disposed at different heights from each other. However, from the viewpoint of forming the high-velocity air flow in the exhaust gap 75 facing the sliding portion 53A and improving the particle collection efficiency, it is preferable that the suction port 32 is opened upward as described above.

Meanwhile, as described above, the front-rear partition plate 35 extends vertically in the upper cover 61 to divide the inside of the upper cover 61 in the front-rear direction, and concentrates the air flow from the lifting gap 65 toward the space where the suction port 32 is opened, thereby increasing the flow rate of air flowing into the suction port 32 (concentration of the flow rate of air). The front-rear partition plate 35 may be shorter in vertical length than the example illustrated in, for example, FIG. 4, and a gap may be formed between the front-rear partition plate 35 and the fixing member 34B, as long as the front-rear partition plate 35 may concentrate the flow rate of air. However, when the height position of the suction port 32 and the height position of the front-rear partition plate 35 is not aligned, the front-rear partition plate 35 may not fulfill its role adequately. Thus, it is preferable that the suction port 32 is disposed at the same height or lower than the upper end of the front-rear partition plate 35, or at the same height or higher than the lower end of the front-rear partition plate 35. When the vertical height of the space in the upper cover 61 is H2 (see, e.g., FIG. 5), the front-rear partition plate 35 may be formed having the length of, for example, H2×½ or more to ensure the effect in concentrating the flow rate of air.

Figure 12:
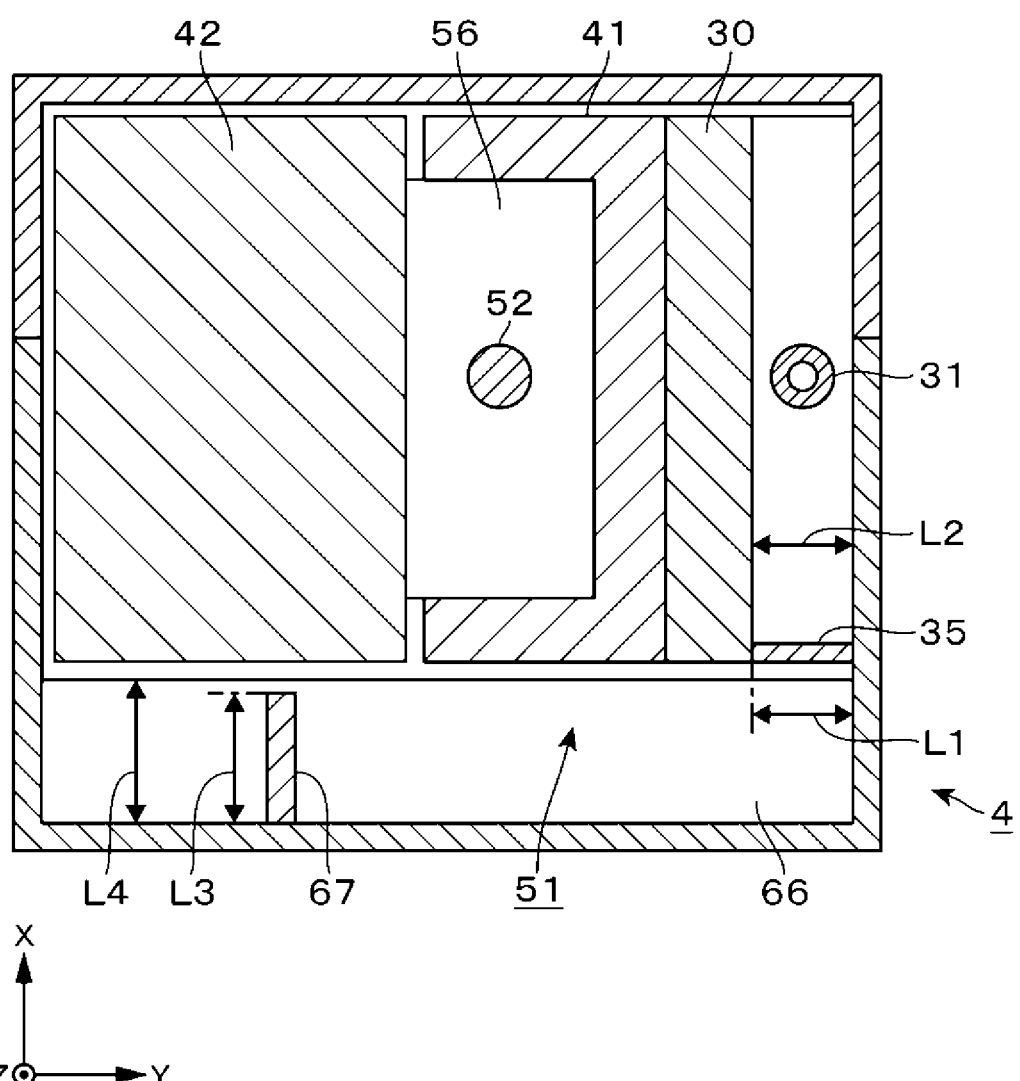
FIG. 12 is a horizontal cross-sectional plan view illustrating another example of the lifting unit.

Further, in order to concentrate the flow rate of air, the front-rear partition plate 35 may protrude from the base unit 41 to be in contact the right wall 62D that makes up the side wall 62 of the upper cover 61. Thus, the distance L2 in the left-right direction (the Y direction) between the base unit 41 and the side wall 62=the width L1 of the front-rear partition plate 35 in the left-right direction (see, e.g., FIG. 12). The present disclosure is not limited to the partitioning by the plate in the front-rear direction (the X-direction), but the partitioning may be implemented by, for example, a block extending in the vertical direction.

In the example described above, the left-right partition plate 67 is formed to vertically extend from the top wall 63 to the lower partition plate 66 while being in contact with the side wall 62, in order to improve the particle scattering prevention effect and the high pressure loss effect, but may not be provided in this form. That is, the left-right partition plate 67 may not be in contact with one or two of the top wall 63, the side wall 62, and the lower partition plate 66 (the bottom wall), such that a gap is formed from the wall that is not in contact with the left-right partition plate 67.

However, in order to fully achieve each of the effects described above, when the vertical height of the space inside the upper cover 61 is H2 (see, e.g., FIG. 5), it is preferable that the length of the left-right partition plate 67 in the vertical direction is equal to the height H2 (such that the upper and lower ends of the left-right partition plate 67 are in contact with the top wall 63 and the lower partition plate 66 of the upper cover 61). Further, when the width L3 of the left-right partition plate 67 in the front-rear direction is overly shorter than the distance L4 in the front-rear direction between the lifting body 42 and the side wall 62, the left-right partition plate 67 may not fulfill its role adequately. Thus, it is preferable to form the left-right partition plate 67 meeting, for example, L3/L4=0.8 or more. The present disclosure is not limited to the partitioning by plate in the left-right direction, but the partitioning may be implemented by, for example, a block extending in the vertical direction.

The left-right partition plate 67 may be provided at a right side relative to the position aligned with the lifting body 42 in the front-rear direction, and for example, may be provided at the position where the front-rear partition plate 67 is aligned with the suction tube support unit 30 in the front-rear direction, and be connected to the suction tube support unit 30. In this case as well, the unnecessary inflow of air into the suction port installation space 36 may be suppressed. However, in this arrangement, the scattering of particles leftward from the drive mechanism 5 is not obstructed by the left-right partition plate 67. Thus, in order to further improve the particle collecting effect, it is preferable to provide the left-right partition plate 67 at the position aligned with the lifting body 42 in the front-rear direction as described above.

As described above, the fixing member 34A takes the role of reducing the space where the suction port 32 is provided, together with the front-rear partition plate 35. However, the present disclosure is not limited to providing the suction port 32 above the fixing member 34A, but may provide the suction port 32 at the same height as the upper surface of the fixing member 34A. Further, the upper end of the suction tube 31 may be disposed at a position slightly lower than the upper surface of the fixing member 34A, and in this case, the through hole of the fixing member 34A serves as the suction port.

While descriptions have been made on an example where the lifting body 42, the base unit 41 provided with the drive mechanism 5, and the suction tube 31 are lined up in this order in the left-right direction, the layout is not limited thereto, and these components may be lined up in a reverse order in the left-right direction, or arranged in this order in the front-rear direction. The arrangement of the lifting body 42, the base unit 41, and the suction tube 31 is not limited to the arrangement in a row, but for example, these components may be arranged such that the direction in which the lifting body 42 and the base unit 41 are arranged and the direction in which the base unit 41 and the suction tube 31 are arranged are orthogonal to each other. Specifically, instead of providing the suction tube 31 on the right side of the base unit 41 as in the example described above, the suction tube 31 may be provided in front of or behind the base unit 41. However, it is preferable to arrange the lifting body 42, the base unit 41, and the suction tube 31 in this order in a row, thereby forming the air flow from the lifting gap 65 into the suction tube 31 through the space above the base unit 41, and further improving the particle collecting effect. The arrangement of the components partitioning the space in the cover unit 6 may be changed appropriately according to the change in layout of the lifting body 42, the base unit 41, and the suction tube 31. While the lifting body 42 has been described as having the rectangular parallelepiped shape, the shape of the lifting body 42 is arbitrary, and may be, for example, a U or C shape in top view.

While the developing apparatus 1 has been described as an example of the substrate processing apparatus, the substrate processing apparatus is not limited to the developing apparatus. Specifically, the substrate processing apparatus may be, for example, a coating film forming apparatus that supplies a chemical liquid for forming various types of films such as a resist film and an insulating film, onto the wafer W from a nozzle. Further, the substrate processing apparatus may be the developing apparatus 1, which is not provided with the developing unit 2, but is configured to perform only the cleaning process (i.e., a cleaning apparatus). Further, for example, the substrate processing apparatus may be configured to include a rotating brush as the processing unit at the distal end of the arm 23, to brush and clean the upper or lower surface of the wafer W by the brush. Accordingly, the processing unit is not limited to the nozzle that ejects the processing liquid. Instead of the nozzle or the brush, the processing unit supported on the arm 23 may be, for example, a heater for heating various films on the upper or lower surface of the substrate, or a light irradiation unit for performing an exposing process on various films on the front or back surface of the substrate.

For example, when the processing unit is a nozzle, the lifting gap 65 is formed at the relatively high position in order to transfer the nozzle inside and outside the cup 13 as described above. That is, since the lifting gap 65 is formed at the height where the released particles may flow into the cup 13 by the downflow of air, it is particularly effective to apply the technology of the present disclosure to the substrate processing apparatus that includes the nozzle as the processing unit. Further, while descriptions have been made on an example where the substrate processing apparatus is installed in the air atmosphere, the substrate processing apparatus may be installed in an atmosphere such as an inert gas atmosphere other than the air atmosphere.

The suction from the suction tube 31 may not necessarily be performed at all times during the operation of the apparatus. For example, assuming that in processing a single wafer W, t1 refers to a time point earlier by predetermined time than when the upward/downward movement of the arm 23 is necessary, and t2 refers to a time point after predetermined time elapses from when the upward/downward movement of the development nozzle 21 and the arm 23 is unnecessary since the processing of the wafer W is completed, the suction may be performed only during the time period of t1 to t2. Accordingly, when sequentially processing a plurality of wafers W in the developing apparatus 1, the suction may be performed for each wafer W, and may be stopped between the time period corresponding to the processing of one wafer W and the time period corresponding to the processing of the next wafer W. Further, the suction may be performed only during the upward/downward movement of the arm 23 (i.e., during the operation of the motor 59). Thus, the processing of the wafer W may be performed while the presence/absence of the suction is switched during the processing of the wafer W. Further, instead of the exhaust mechanism 33, the downstream side of the suction tube 31 may be configured to be connected to an exhaust line of a plant having a negative pressure atmosphere, such that the presence/absence of the suction is switched by opening/closing of a valve provided in the suction tube 31.

The drive mechanism is not limited to the configuration in which the slider 56 is moved up and down by the linear movement unit 51 including the ball screw 52. For example, the drive mechanism may be configured with the motor 59, two paired pulleys, and an endless belt wound around the two pulleys, such that when one of the two pulleys rotates by the motor 59, the belt is driven, and the slider 56 connected to the belt moves up and down. Further, the drive mechanism may be configured with a linear movement mechanism that does not use the motor 59 such as an air cylinder, or for example, a linear motor.

The substrate processed in the apparatus is not limited to the wafer W, but may be a flat panel display (FPD) substrate or a mask substrate for manufacturing an exposure mask.

The present disclosure provides a substrate processing apparatus including an upwardly/downwardly movable processing unit for processing substrates, and may prevent the contamination of substrates caused by particles generated from a drive mechanism.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a base including a driver;
   a cover enclosing the base;
   a lifting body protruding from an internal region enclosed by the cover to an external region outside the internal region, and configured to move up and down with respect to the base by the driver;
   a processing body connected to the lifting body in the external region, and configured to process a substrate; and
   a suction tube having a suction port configured to suck particles generated from the driver,
   wherein the driver includes a slider connected to the lifting body, and the suction port is opened at a higher position than a center of a height of a vertically movable range of the slider.

2. The substrate processing apparatus according to claim 1, wherein the suction port is provided in the internal region.

3. The substrate processing apparatus according to claim 2, wherein the suction port communicates with the external region through a gap formed between the cover and the lifting body.

4. The substrate processing apparatus according to claim 3, wherein the cover includes a top wall that covers the base from above and allows the lifting body to penetrate therethrough, and a space between the top wall and the base communicates with the gap to serve as a suction path through which the particles are sucked from the suction port.

5. The substrate processing apparatus according to claim 4, wherein the suction port is opened upward.

6. The substrate processing apparatus according to claim 2, wherein in the internal region, a first partition is provided to extend horizontally while dividing the internal region into an upper space where the suction port is provided and a lower space below the upper space.

7. The substrate processing apparatus according to claim 1, wherein in the internal region, a second partition is provided to extend vertically while dividing the internal region into a one-side space where the suction port is provided and an opposite-side space positioned beside the one-side space.

8. The substrate processing apparatus according to claim 1, wherein the lifting body, the base, and the suction tube are arranged horizontally in this order in the internal region, and in the internal region, a third partition is provided on a side of the lifting body with respect to the driver to extend vertically while dividing the internal region into two spaces arranged in an arrangement direction of the lifting body, the base, and the suction tube.

9. The substrate processing apparatus according to claim 8, wherein the cover includes a side wall enclosing the lifting body, the base, and the suction tube from side, a top wall covering the base from above and allowing the lifting body to penetrate therethrough, a bottom wall formed below the top wall and protruding from the side wall toward a lifting path of the lifting body.

10. The substrate processing apparatus according to claim 9, wherein the lifting body is provided with a support that supports the processing body, and the processing body is either a nozzle or a brush supported by the support.

11. The substrate processing apparatus according to claim 1, further comprising:

a processing container configured to accommodate the substrate; and a substrate holder configured to hold the substrate in the processing container to process the substrate using the processing body.

12. The substrate processing apparatus according to claim 1, wherein a suction is performed from the suction port at all times during an operation of the substrate processing apparatus.

13. The substrate processing apparatus according to claim 1, wherein the substrate processing apparatus further includes a suction tube supporter configured to support the suction tube, and the suction port is opened at a height lower than an upper end of the suction tube supporter.

14. The substrate processing apparatus according to claim 1, wherein the substrate processing apparatus further includes a ball screw, the slider being connected to the ball screw and configured to move up and down along a rotation of the ball screw.

15. A substrate processing method comprising:

providing a substrate processing apparatus including:

a base including a driver;

a cover enclosing the base;

a lifting body protruding from an internal region enclosed by the cover to an external region outside the internal region, and configured to move up and down with respect to the base by the driver;

a processing body connected to the lifting body in the external region, and configured to process a substrate; and a suction tube having a suction port configured to suck particles generated from the driver, moving up and down the lifting body with respect to the base;

processing the substrate by the processing body; and sucking particles generated from the driver, by the suction port provided in the suction tube, wherein:

the suction port is provided in the internal region enclosed by the cover;

the driver includes a slider connected to the lifting body; and the suction port is opened at a higher position than a center of a height of a vertically movable range of the slider.

\* \* \* \* \*